US008252263B2

(12) United States Patent
Sung

(10) Patent No.: US 8,252,263 B2
(45) Date of Patent: Aug. 28, 2012

(54) DEVICE AND METHOD FOR GROWING DIAMOND IN A LIQUID PHASE

(76) Inventor: Chien-Min Sung, Tansui (TW)

( * ) Notice: Subject to any disclaimer, the term of this patent is extended or adjusted under 35 U.S.C. 154(b) by 456 days.

(21) Appl. No.: 12/423,145

(22) Filed: Apr. 14, 2009

(65) Prior Publication Data

US 2009/0257942 A1 Oct. 15, 2009

Related U.S. Application Data

(60) Provisional application No. 61/044,848, filed on Apr. 14, 2008.

(51) Int. Cl.
*B01J 3/06* (2006.01)
*A62D 3/00* (2007.01)
(52) U.S. Cl. .................. 423/446; 422/199
(58) Field of Classification Search .............. None
See application file for complete search history.

(56) References Cited

U.S. PATENT DOCUMENTS

| 187,593 A | 2/1877 | Brown et al. |
| 1,988,065 A | 1/1935 | Wooddell |
| 2,078,354 A | 4/1937 | Webster |
| 2,268,663 A | 1/1942 | Kuzmick |
| 2,612,348 A | 9/1952 | Catallo |
| 2,725,693 A | 12/1955 | Smith |
| 2,811,960 A | 11/1957 | Fessel |
| 2,867,086 A | 1/1959 | Haley |
| 2,876,086 A | 3/1959 | Raymond |
| 2,947,608 A | 8/1960 | Hall |
| 2,952,951 A | 9/1960 | Simpson |
| 3,067,551 A | 12/1962 | Maginnis |
| 3,121,981 A | 2/1964 | Hurst |
| 3,127,715 A | 4/1964 | Christensen |
| 3,146,560 A | 9/1964 | Hurst |
| 3,276,852 A | 10/1966 | Lemelson |
| 3,293,012 A | 12/1966 | Smiley |

(Continued)

FOREIGN PATENT DOCUMENTS

EP 0238434 3/1987

(Continued)

OTHER PUBLICATIONS

Sung, James C., "The Eastern Wind of Diamond Synthesis", New Diamond and Frontier Carbon Technology, (2003) vol. 13, No. 1, pp. 47-61.

(Continued)

*Primary Examiner* — Melvin C Mayes
*Assistant Examiner* — Guinever Gregorio
(74) *Attorney, Agent, or Firm* — Thorpe North & Western LLP

(57) ABSTRACT

A method of growing a diamond mass in a liquid growth medium. The liquid growth medium can include a carbon source, a diamond growth catalyst such as a diamond catalyst metal-rare earth element alloy or nanocatalyst, and a dissociated hydrogen of a hydrogen source. The carbon source provides carbon atoms for growing diamond and can include a diamond seed material for diamond growth. The molten liquid phase provides a diamond growth catalyst which allows the carbon to form diamond at the temperature and low pressure conditions discussed. Furthermore, the dissociated hydrogen acts as a concentrator for assembling carbon atoms at a relatively high concentration which mimicks, in some respects, diamond growth under more conventional high pressure processes without the high pressure.

19 Claims, 3 Drawing Sheets

U.S. PATENT DOCUMENTS

| | | |
|---|---|---|
| 3,372,010 A | 3/1968 | Parsons |
| 3,630,699 A | 12/1971 | Catlin |
| 3,661,526 A * | 5/1972 | Angus et al. ................... 117/64 |
| 3,802,130 A | 4/1974 | Lindenbeck |
| 3,894,673 A | 7/1975 | Lowder et al. |
| 3,982,358 A | 9/1976 | Fukuda |
| 4,018,576 A | 4/1977 | Lowder et al. |
| 4,149,881 A | 4/1979 | D'Silva |
| 4,182,628 A | 1/1980 | D'Silva |
| 4,211,294 A | 7/1980 | Multakh |
| 4,228,214 A | 10/1980 | Steigelman et al. |
| 4,229,186 A | 10/1980 | Wilson |
| 4,273,561 A | 6/1981 | Fernandez-Moran Villalobos |
| 4,287,168 A | 9/1981 | Wentorf et al. |
| 4,341,532 A | 7/1982 | Oide |
| 4,355,489 A | 10/1982 | Heyer et al. |
| 4,547,257 A | 10/1985 | Iizuka et al. |
| 4,551,195 A | 11/1985 | Iizuka et al. |
| 4,565,034 A | 1/1986 | Sekiya |
| 4,610,699 A | 9/1986 | Yazu et al. |
| 4,617,181 A | 10/1986 | Yazu et al. |
| 4,632,817 A | 12/1986 | Yazu et al. |
| 4,669,522 A | 6/1987 | Griffin |
| 4,680,199 A | 7/1987 | Vontell et al. |
| 4,712,552 A | 12/1987 | Pangburn |
| 4,749,514 A | 6/1988 | Murakami et al. |
| 4,780,274 A | 10/1988 | Barr |
| 4,866,888 A | 9/1989 | Murai et al. |
| 4,883,500 A | 11/1989 | Deakins et al. |
| 4,908,046 A | 3/1990 | Wiand |
| 4,916,869 A | 4/1990 | Oliver |
| 4,925,457 A | 5/1990 | deKok et al. |
| 4,927,619 A | 5/1990 | Tsuji |
| 4,943,488 A | 7/1990 | Sung et al. |
| 4,945,686 A | 8/1990 | Wiand |
| 4,949,511 A | 8/1990 | Endo et al. |
| 4,968,326 A | 11/1990 | Wiand |
| 5,000,273 A | 3/1991 | Horton et al. |
| 5,022,895 A | 6/1991 | Wiand |
| 5,030,276 A | 7/1991 | Sung et al. |
| 5,049,165 A | 9/1991 | Tselesin |
| 5,092,082 A | 3/1992 | Padberg et al. |
| 5,092,910 A | 3/1992 | Dekok et al. |
| 5,131,924 A | 7/1992 | Wiand |
| 5,133,782 A | 7/1992 | Wiand |
| 5,164,247 A | 11/1992 | Solanki et al. |
| 5,176,155 A | 1/1993 | Rudolph, Jr. |
| 5,190,568 A | 3/1993 | Tselesin |
| 5,194,070 A | 3/1993 | Sumiya et al. |
| 5,197,249 A | 3/1993 | Wiand |
| 5,203,881 A | 4/1993 | Wiand |
| 5,246,884 A | 9/1993 | Jaso et al. |
| 5,264,011 A | 11/1993 | Brown et al. |
| 5,266,236 A | 11/1993 | Bovenkerk |
| 5,273,730 A | 12/1993 | Yoshida et al. |
| 5,328,548 A | 7/1994 | Tsuji et al. |
| 5,380,390 A | 1/1995 | Tselesin |
| 5,443,032 A | 8/1995 | Vichr et al. |
| 5,453,106 A | 9/1995 | Roberts |
| 5,454,343 A | 10/1995 | Eun et al. |
| 5,518,443 A | 5/1996 | Fisher |
| 5,527,424 A | 6/1996 | Mullins |
| 5,620,489 A | 4/1997 | Tselesin |
| 5,660,894 A | 8/1997 | Chen et al. |
| 5,674,572 A | 10/1997 | Sarin et al. |
| 5,746,931 A | 5/1998 | Graebner et al. |
| RE35,812 E | 6/1998 | Oliver |
| 5,772,756 A | 6/1998 | Davies et al. |
| 5,779,743 A | 7/1998 | Wood |
| 5,801,073 A | 9/1998 | Robbins et al. |
| 5,816,891 A | 10/1998 | Woo |
| 5,820,450 A | 10/1998 | Calhoun |
| 5,833,519 A | 11/1998 | Moore |
| 5,902,173 A | 5/1999 | Tanaka |
| 5,916,011 A | 6/1999 | Kim et al. |
| 5,921,856 A | 7/1999 | Zimmer |
| 5,961,373 A | 10/1999 | Lai et al. |
| 5,980,852 A | 11/1999 | Burns et al. |
| 5,980,982 A | 11/1999 | Degawa et al. |
| 6,001,174 A | 12/1999 | Fang |
| 6,030,595 A | 2/2000 | Sumiya et al. |
| 6,039,641 A * | 3/2000 | Sung ........................ 451/540 |
| 6,106,382 A | 8/2000 | Sakaguchi |
| 6,123,612 A | 9/2000 | Goers |
| 6,159,286 A | 12/2000 | Sung |
| 6,190,240 B1 | 2/2001 | Kinoshita et al. |
| 6,213,856 B1 | 4/2001 | Cho et al. |
| 6,286,498 B1 | 9/2001 | Sung |
| 6,342,195 B1 * | 1/2002 | Roy et al. ...................... 423/446 |
| 6,368,198 B1 | 4/2002 | Sung et al. |
| 6,478,831 B2 | 11/2002 | Tselesin |
| 6,497,853 B1 | 12/2002 | Davies et al. |
| 6,544,599 B1 | 4/2003 | Brown et al. |
| 6,616,725 B2 | 9/2003 | Cho et al. |
| 6,627,168 B1 | 9/2003 | Ohtsubo et al. |
| 6,679,243 B2 | 1/2004 | Sung |
| 6,835,365 B1 | 12/2004 | Davies et al. |
| 6,979,357 B2 | 12/2005 | Fries et al. |
| 7,124,753 B2 | 10/2006 | Sung |
| 7,323,049 B2 | 1/2008 | Sung |
| 7,368,013 B2 | 5/2008 | Sung |
| 7,404,857 B2 | 7/2008 | Sung |
| 7,547,358 B1 * | 6/2009 | Shapiro ........................ 117/68 |
| 2009/0286352 A1 * | 11/2009 | Sung ............................ 438/105 |

FOREIGN PATENT DOCUMENTS

| | | |
|---|---|---|
| EP | 0280657 | 8/1988 |
| EP | 0331344 | 2/1989 |
| EP | 0264674 | 9/1995 |
| EP | 0712941 | 5/1996 |
| JP | 06182184 | 7/1994 |
| JP | 10128654 A | 5/1998 |
| JP | 10180618 A | 7/1998 |
| JP | 11048122 A | 2/1999 |
| JP | 11077536 A | 3/1999 |
| WO | WO 95/27596 | 10/1995 |
| WO | WO 98/10897 | 3/1998 |
| WO | WO/98/45091 | 3/1998 |
| WO | WO 98/45092 | 3/1998 |
| WO | WO 98/51448 | 3/1998 |

OTHER PUBLICATIONS

Mechanism of the Solvent-Assisted Graphite to Diamond Transition Under High Pressure: Implications for the Selection of Catalysts, High Temperatures-High Pressure, 1995/1996, vols. 27/28, pp. 523-546.

* cited by examiner

DEVICE AND METHOD FOR GROWING DIAMOND IN A LIQUID PHASE

PRIORITY DATA

This application claims the benefit of U.S. Provisional Patent Application Ser. No. 61/044,848 filed on Apr. 14, 2008, which is incorporated herein by reference.

FIELD OF THE INVENTION

The present invention is directed toward synthesis of diamond in a liquid phase. Therefore, the present invention involves the fields of materials science and diamond synthesis.

BACKGROUND OF THE INVENTION AND RELATED ART

Diamond materials have a large variety of applications ranging from gems to industrial application such as semiconductor devices, abrasive tools, and optical devices. Large diamonds can be made by conventional chemical vapor deposition (CVD) methods but these approaches are very slow and costly for more than a few microns in thickness. On the other hand, larger diamond particles have been made by using ultrahigh pressure apparatuses (e.g. belt apparatus, cubic press) with pressures up to several gigapascals under largely solid phase growth of diamond. Due to volume limitations inherent in these devices, the throughput has been low (e.g. one crystal per machine) and the cost has been high. In the case of ultrahigh pressure devices, diamond can grow relatively fast (>1 mm per hour) which is about one order of magnitude higher than CVD diamond.

Conventional CVD diamond film is deposited under partial vacuum at about 900° C. Normally, graphite with $sp^2$ hybridization should be the stable phase, but because of the presence of hydrogen atoms (not molecules of $H_2$), the decomposed carbon atoms from carbonaceous gas (e.g. methane) is bombarded with hydrogen atoms to maintain its diamondoid structure ($sp^3$ hybridization). The growth rate and the quality of CVD diamond are highly dependent on the concentration of hydrogen atoms.

Unfortunately, hydrogen atoms are made by dissociation of hydrogen molecules. This requires a high temperature (>2000° C.), while the mean free path of dissociated hydrogen atoms is short, such that most hydrogen atoms recombine to form molecules to release heat. Consequently, the concentration of hydrogen atoms near the substrate is low. And hence, the growth of diamond film is slow (a few microns per hour). This problem cannot be solved by merely moving the substrate closer to the heat source as graphite will be formed at high temperatures. Thus, conventional CVD diamond processes have a dilemma that high temperature boosts the production of hydrogen atoms, but diamond must be deposited at lower temperature where hydrogen atoms have recombined.

SUMMARY OF THE INVENTION

In light of the problems and deficiencies with present diamond synthesis approaches, the present invention seeks to overcome these by growing a diamond mass in a liquid growth medium. The liquid growth medium can include a carbon source, a diamond growth catalyst, and a dissociated hydrogen of a hydrogen source. The carbon source provides carbon atoms for growing diamond. A diamond seed material can also be included in contact with the liquid growth medium for diamond growth such as a plurality of diamond seeds or a crystalline wafer. The molten liquid phase provides a diamond growth catalyst which allows the carbon to form diamond at the temperature and pressure conditions discussed. The diamond growth catalyst can be an alloy of a diamond catalyst metal and a rare earth element, and/or a nanocatalyst as described more fully hereinafter. Furthermore, the dissociated hydrogen acts as a concentrator for assembling carbon atoms at a relatively high concentration which mimics, in some respects, diamond growth under more conventional high pressure processes without the high pressure.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

The present invention will become more fully apparent from the following description and appended claims, taken in conjunction with the accompanying drawings. Understanding that these drawings merely depict exemplary embodiments of the present invention and they are, therefore, not to be considered limiting of its scope. It will be readily appreciated that the components of the present invention, as generally described and illustrated in the figures herein, could be arranged, sized, and designed in a wide variety of different configurations. Nonetheless, the invention will be described and explained with additional specificity and detail through the use of the accompanying drawings in which:

DETAILED DESCRIPTION OF EXEMPLARY EMBODIMENTS

Figure 1:
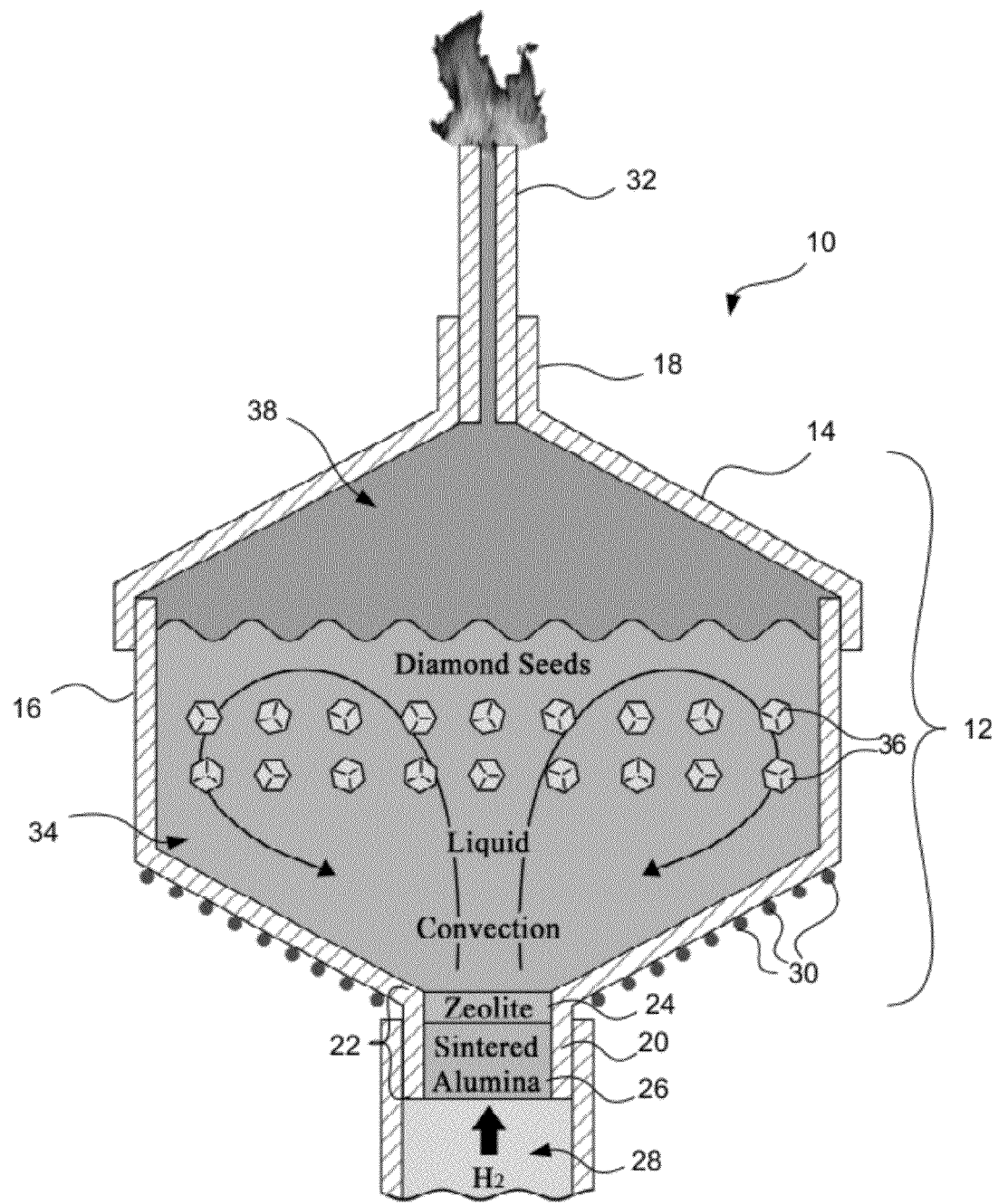
FIG. 1 is a side cross-sectional view of a diamond growth furnace having a two layer molten liquid in accordance with one embodiment of the present invention.

The following detailed description of exemplary embodiments of the invention makes reference to the accompanying drawings, which form a part hereof and in which are shown, by way of illustration, exemplary embodiments in which the invention may be practiced. While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

The following detailed description and exemplary embodiments of the invention will be best understood by reference to the accompanying drawings, wherein the elements and features of the invention are designated by numerals throughout.

DEFINITIONS

In describing and claiming the present invention, the following terminology will be used.

The singular forms "a," "an," and "the" include plural referents unless the context clearly dictates otherwise. Thus, for example, reference to "a catalyst" includes reference to one or more of such materials and reference to "heating" refers to one or more such steps.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "fluid communication" refers to a continuous unimpeded fluid path between two volumes, such that fluids, e.g. liquids or gases, can flow between the two volumes substantially unimpeded.

As used herein, "diamond growth catalyst" refers to any metal or material which acts to facilitate formation of diamond from a carbon source under conditions which would otherwise not form diamond in the absence of such a diamond growth catalyst.

As used herein, "dissociated hydrogen" refers to atomic hydrogen which is not bonded to another atom. Unlike diatomic hydrogen, i.e. $H_2$, a dissociated hydrogen is available for participation in diamond growth as described more fully herein. Dissociated hydrogen is highly reactive and can quickly reform hydrogen gas or other compounds. The dissociated hydrogen can be formed in close proximity to growing diamond and/or can be continuously regenerated by introduction of hydrogen gas along with a suitable hydrogen catalyst.

As used herein, "three dimensional growth" refers to crystal growth which occurs by addition of atoms to a crystal lattice from substantially all directions as opposed to growth limited to a single crystal surface. In the present invention, such three dimensional growth occurs as the growing diamond particles are suspended in the liquid growth medium.

As used herein, "heating" refers to introducing heat into a material, whether the temperature of the heated material is increasing or merely maintained during heating. In contrast, "cooling" is a reduction of heating rate, even when heat continues to be introduced, albeit at a lower rate.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims unless otherwise stated. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

EMBODIMENTS OF THE INVENTION

A method of growing diamond can include growing a diamond mass in a liquid growth medium. The liquid growth medium can include a carbon source, a diamond growth catalyst, and a dissociated hydrogen of a hydrogen source. Each of these components of the liquid growth medium have a distinct purpose in facilitating diamond growth in accordance with the present invention. The carbon source provides carbon atoms for growing diamond and can optionally include diamond seed material for diamond growth. The molten liquid phase provides a diamond growth catalyst which allows the carbon to form diamond at the temperature and pressure conditions discussed. Furthermore, the dissociated hydrogen acts as a concentrator for assembling carbon atoms at a relatively high concentration which mimics, in some respects, diamond growth under more conventional high pressure processes without the high pressure.

The carbon source can be any carbon-containing material which is suitable for providing carbon atoms to growing diamond particles in the liquid medium. As a general guideline, the carbon source can include substantially only carbon or carbon and hydrogen although other carbon materials may be suitable. The carbon source can be provided as a gas, a liquid, or as a particulate solid. Non-limiting examples of suitable carbon source materials can include methane, acetylene, adamantane, graphite, diamond, diamondoid, nanodiamond, derivatives of these materials, or the like. Relatively pure carbon sources such as graphite, diamond, diamondoid (e.g. adamantane), or nanodiamond can be particularly effective from a manufacturing efficiency standpoint. However, sources which include substantially only carbon and hydrogen can also act as a carbon source and a hydrogen source, e.g. methane and acetylene. Similarly, adamantane is a liquid at the operating temperatures involved and can allow use of nanocatalysts instead of a rare earth alloy, as discussed further below.

The particulate carbon source can also act as a diamond seed. Generally, a diamond seed material can be a plurality of diamond seeds or a suitable crystalline wafer. Suitable diamond seeds can be included in the liquid growth medium. Regardless, a plurality of diamond seeds can be dispersed in the liquid growth medium such that a plurality of diamond particles can grow with carbon from the carbon source. The diamond seeds can be formed of any suitable material which can provide a particulate substrate for diamond growth. Materials such as diamond, nanodiamond and diamondoid can be suitable, although other materials which have a lattice structure similar to diamond can also be suitable, such as but not limited to, cubic boron nitride, silicon carbide, aluminum nitride, and the like. When growing a plurality of diamond particles from particulate diamond seeds diamond, nanodiamond and cubic boron nitride can be particularly useful. Similarly, when growing a diamond plate from a crystalline wafer a silicon wafer or aluminum nitride wafer may be used. For example, a silicon wafer can gradually grown to silicon carbide and then to diamond. As a general rule, tetrahedrally bonded covalent lattice structure can be used as a seed material, although interatomic distances which diverge from diamond lattice positions significantly can require gradation to avoid excessive crystal defects.

The plurality of diamond seeds can be fixed in place and/or included within the liquid medium as free particles. In the case of free particles, the diamond seeds can be dispersed into the liquid medium either before or after forming the molten liquid phase of the diamond growth catalyst alloy. In this case, the grown diamond particles can often have a relatively wide size distribution due to non-uniform temperature conditions during convective circulation within the liquid growth medium. Similarly, diamond seeds can be fixed to a suitable surface which is in contact with the liquid growth medium. When fixed in position, temperature can be accurately controlled sufficient to monitor quality and uniformity of size for the final grown diamond particles. For example, diamond seeds can be affixed to a removable or fixed substrate within a furnace. Diamond seeds can be any suitable size and are largely governed by cost and availability. For example, diamond seeds from about 1 μm to about 200 μm are readily available. Larger diamond seeds can also be used for specific products. In some cases it may be desirable to use previously grown diamond seeds of 200 μm up to 10 mm (or larger) in size in order to facilitate growth of large diamonds for specific applications, e.g. gem diamonds, single point dressers, optical devices, etc. Thus, diamond growth can include one or more growth stages which can be performed sequentially with substantially no intervening time or may have a time delay between growth stages. The concentration of diamond seeds in the liquid growth medium can vary widely and can depend on the desired yields, hydrogen concentration, and activity of the molten catalyst alloy. However, as a general guideline, diamond seeds can range from about 1 vol % to about 90 vol % and often from about 5 vol % to about 10 vol %. Generally, a larger particulate diamond seed allows for lower volume percent. When nanodiamond is used as seed material, some of the nanodiamond will act as diamond growth centers while others will dissolve as a carbon source so the original volume percent is clearly not maintained throughout growth stages.

Furthermore, the diamond seed material can be provided as a single or multiple crystalline wafers. For example, a silicon wafer can be placed in contact with the liquid growth medium. By controlling a temperature gradient across the liquid to the wafer surface silicon crystalline lattice can be graded into silicon carbide and ultimately diamond. Reduced or eliminated defects in the growing crystal lattice can be optionally facilitated by cycling of carbon deposition, e.g. by cycling the temperature gradient. This can allow for misplaced atoms to be removed and replaced in more favorable lattice positions, e.g. matching a diamond lattice.

In accordance with the present invention, the diamond growth catalyst can be an alloy of a diamond catalyst and a rare earth element. The diamond catalyst can generally include any conventional diamond growth catalyst such as, but not limited to, Fe, Co, Ni, Pd, alloys thereof, and combinations thereof. Other materials can be used which are carbon solvents and not strong carbide formers.

Figure 3:
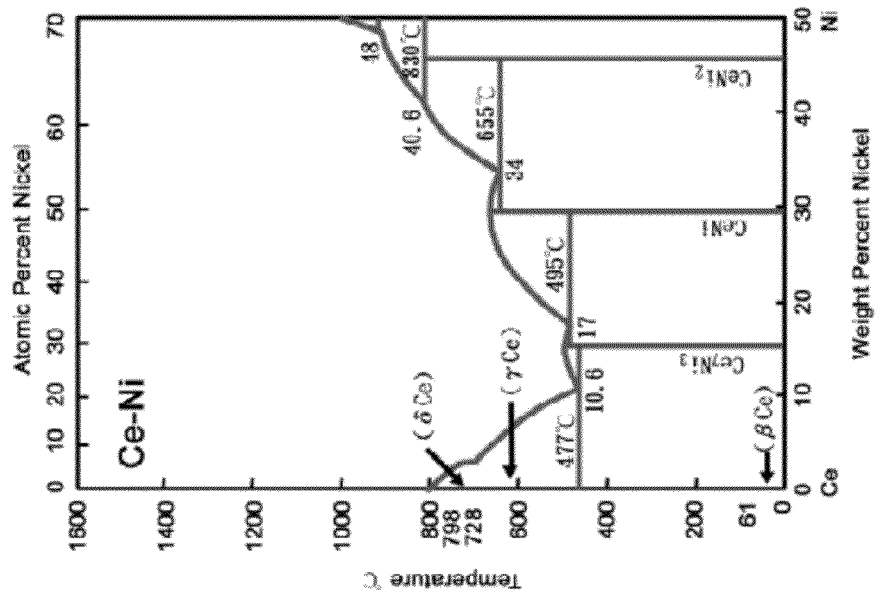
FIG. 3 is a phase diagram for Ce—Ni alloys used in connection with one embodiment of the present invention.
Figure 2:
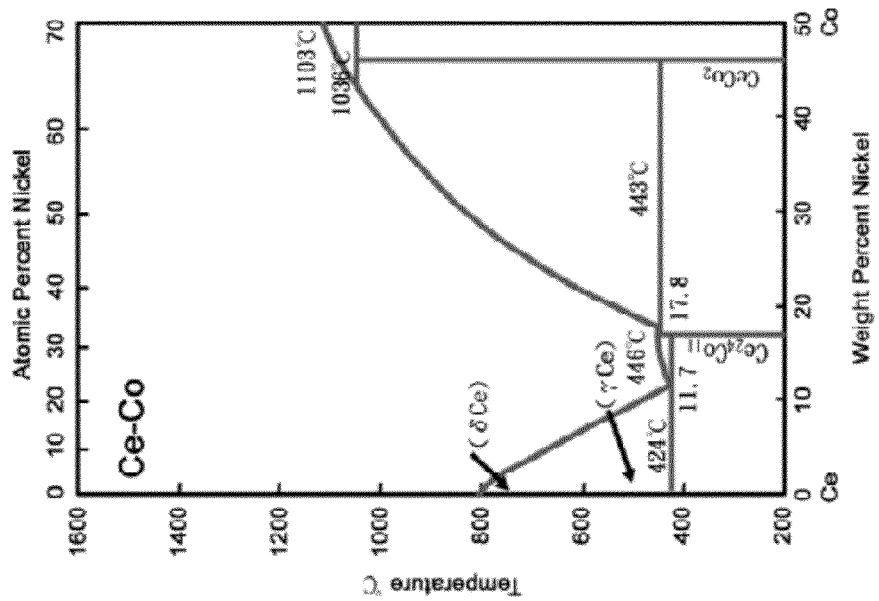
FIG. 2 is a phase diagram for Ce—Co alloys used in connection with one embodiment of the present invention.

With respect to the rare earth element, non-limiting examples of suitable elements include La, Ce, and combinations thereof, although Sm, Gd, or Nd could also be used. Further, the diamond growth catalyst can be a ternary alloy. Specific non-limiting examples of suitable diamond growth catalysts for use in the present invention can include Ce—Co, Ce—Ni, and combinations thereof FIGS. 2 and 3 are phase diagrams for each of Ce—Co and Ce—Ni, respectively. As can be seen in FIG. 2, Ce—Co alloys exhibit suitable melting temperatures at Co weight percents from 0% to about 27%, with eutectics at 11.7% and 17.8% Co. Similarly, FIG. 3 shows that Ce—Ni alloys with Ni weight content from about 0% to about 40%, with eutectics at 10.6%, 17%, and 34% Ni can be suitable. Similar assessments can be made for other catalyst metal-rare earth alloys to determine suitable alloys for use in the present invention.

Additives may be optionally included which provide specific benefits. For example, carbide formers such as Ti, V and the like may be used to scavenge nitrogen resulting in colorless diamond. However, such carbide formers can also create diamond defects in the growing diamond lattice. Dopants can also be included to provide specific colors, e.g. boron for blue diamond, or change electrical properties of the diamond. For example, boron doping can render the diamond a P-type semiconductor while Li, Mg, or the like can be used to render the diamond an N-type semiconductor. More specifically, doping with Li—N binary can allow the low binding force of lithium to facilitate movement of neighboring nitrogen electrons. However, as a general guideline such additives should most often be kept below 1 wt % (100 ppm) in the molten catalyst to avoid poor diamond growth.

In addition, the growth catalyst can include additives which control the growth rate of diamond, e.g. by limiting carbon diffusion, and also prevent excess nitrogen and/or oxygen from diffusing into the diamond. Suitable additives can include Mg, Ca, Si, Mo, Zr, Ti, V, Nb, Zn, Y, W, Cu, Al, Au, Ag, Pb, B, Ge, In, Sm, and compounds of these materials with C and B.

Regardless of the specific components of the diamond growth catalyst, melting temperature is one variable which can strongly contribute to its efficacy as a suitable catalyst. Although other melting points may be suitable, as a general guideline, the diamond growth catalyst can have a melting point from about 600° C. to about 1000° C., and preferably from about 800° C. to about 900° C. Furthermore, suitable diamond growth catalyst alloys can have a substantial solubility for both carbon and hydrogen. For example, palladium and platinum can be used to allow catalytic absorption of hydrogen atoms, e.g. Ni—Pd—Ce. The molten liquid phase can comprise sufficient volume to completely encompass each growing diamond particle with the molten catalyst alloy. In such a solvent, both carbon and hydrogen atoms take void positions in the molten metal atoms. Almost all carbon atoms can be surrounded and stabilized by catalytic metal atoms and hydrogen atoms such that the diamondoid or $sp^3$ structure is maintained. Typically, the molten liquid phase can be a continuous phase in which the growing diamond particles and carbon source are dispersed. Accordingly, the molten liquid phase typically comprises from 20 vol % to about 99 vol % of the liquid growth medium.

In one alternative embodiment of the present invention, the liquid growth medium can further include a second molten liquid phase including a second particulate carbon source and a hydrogen catalyst. The second molten liquid phase can also be chosen to have a lower density than that of the primary molten liquid phase. In this manner the upper layer can also act as a dampening layer to prevent molten liquid from being entrained with exiting gases and potentially exiting the furnace and/or clogging the gas outlet by condensing on relatively cooler surfaces. In addition, each layer can have a different growth rate, e.g. molten catalyst tends to be faster growth than using organic solvent with nanocatalyst which allows slower growth but smoother growth surfaces.

The liquid growth medium can further include a hydrogen catalyst which can be present as a liquid, dispersed solid particles, and/or embedded on a porous support substrate. The hydrogen catalyst can be any material which is capable of reducing the hydrogen source to dissociated hydrogen. Non-limiting examples of suitable hydrogen catalysts include nano-platinum particles, nano-nickel particles, and mixtures or composites of these materials. Alternatively, or in addition, the hydrogen source can be passed across a porous ceramic prior to entry into the liquid growth medium. Non-limiting examples of suitable porous ceramic can include zeolite, sintered alumina, a sequential layered structure of zeolite and sintered alumina, or a composite thereof, although sintered alumina or zirconia may also be used. A layered structure can be beneficial to provide structural support to the weaker zeolite and increase surface area to allow increase flow of hydrogen source gas. Optionally, the porous ceramic can further include a hydrogen catalyst coated or embedded thereon. One specific example is a $La_{0.83}Sr_{0.17}MnO_3$ ceramic with nano-nickel or nano-platinum embedded thereon. The porous ceramic can optionally include a molecular sieve pore structure.

The hydrogen source can also be provided to supply dissociated hydrogen to the liquid growth medium. The hydrogen source can be hydrogen gas or any other suitable hydrogen-containing precursor which is capable of directly or indirectly producing dissociated hydrogen. Non-limiting examples of a hydrogen source can include hydrogen gas, methane, acetylene, or other carbon/hydrogen materials. Gases such as methane and acetylene can also act as a sole or supplemental carbon source material. The hydrogen source and accompanying hydrogen catalyst can be present in an amount sufficient to mitigate carbon diffusion to growing surfaces of the diamond particles.

Furthermore, the hydrogen source can be dispersed in the molten liquid phase under a low pressure. Typically, the low pressure can be from vacuum to about 10 atm, although pressures less than about 10 atm, and often less than about 5 atm can be desirable. In this manner, low pressures can allow for the use of low cost equipment and materials as opposed to the conventional ultra high pressure devices with their associated difficulties and challenges, e.g. operating tolerances, materials, etc. The hydrogen source can be supplied at a suitable pressure to allow entrance of gases into the liquid growth medium and across any porous media oriented at the inlet to the furnace as described in more detail below. Thus, the supply pressure can typically range from about 5 psig to about 200 psig although other pressures can also be suitable. The hydrogen source can also be injected into the liquid growth medium during heating so as to create an upward mixing flow within the liquid growth medium sufficient to keep the particulate carbon source and/or growing diamond particles suspended.

Diamond growth can occur within a temperature profile for a time sufficient to allow three dimensional growth of the plurality of diamond particles from the particulate carbon source. The growth of diamond in accordance with the present invention can be considered metastable growth of diamond and is most often epitaxial growth. In particular, the low pressures associated with the present invention are well below conventional diamond growth parameters. The time for diamond growth can vary depending on the size of the initial diamond seeds and the desired final size. However, as a general guideline, the growth rate of diamond particles can be from about 10 μm/hr to about 100 μm/hr per surface in one-dimension.

In practice, the liquid growth medium can be formed in a number of ways. Each component can be added in various orders and may be included before or after heating is applied. For example, a particulate carbon source and a particulate diamond growth catalyst alloy can be mixed in the furnace and heated to melt the alloy. The hydrogen source can be initiated before, during or after melting of the alloy. Similarly, the diamond seeds can be added at any point. As a general rule, it can be desirable to add each of the carbon source, diamond growth alloy and diamond seeds prior to initiation of heating so that the process can be a one step rather than injecting one or more components during heating. Each component may optionally be loaded as strata or layers based on molten density differences, e.g. more dense above to encourage mixing.

Alternatively, the particulate carbon source can be initially provided as a solid mass such as a wafer, bar or fragmented mass. During heating the carbon source dissolves or is carbonized to form the particulate carbon source. Similarly, the diamond growth catalyst alloy can be provided as a powder, one or more solid chunks, or even formed in situ during heating. Typically, the liquid growth medium can fill a majority of available volume within the furnace. A small volume can be left open for escape of unused and/or excess gaseous products which can be vented. This space can also allow for some small expansion of the liquids during heating and diamond growth without risking mechanical deformation or failure of furnace walls or spillage of liquid from the furnace.

In accordance with the present invention, the liquid growth medium can be heated using any suitable approach. For example, heating can be accomplished using electrical heating. Application of heat can be accomplished in a variety of ways to achieve specific predetermined temperature profiles across the liquid growth medium and/or varying profiles over time. For example, in one embodiment, the temperature profile can include a temperature gradient from the hydrogen source inlet to a gas purge outlet opposite the inlet. In this manner, a substantially continuous temperature gradient can exist across the liquid growth medium from a hot region to a cooler region. In addition, the temperature profile (including associated gradients) can vary or be substantially constant during growth of the diamond particles. As a general guideline, when operating temperatures are excessive hydrogen atoms will be depleted and may turn carbon to graphite. Conversely, if operating temperatures are too low, hydrogen abstraction would be extremely slow, reducing diamond growth rates. A temperature gradient allows the formation of a suitable chemical potential of hydrogen atoms. Further, the temperature gradient also effects the degree of convection, along with the gas flow of hydrogen. Typically, the operating temperature can range from about 300° C. to about 900° C., although 600° C. to about 800° C. can also be particularly suitable.

Once the desired degree of growth has been achieved, the grown diamond particles can be removed from the molten liquid phase or from a solidified mass formed from cooling the molten liquid phase. In one embodiment of the present invention, the liquid growth medium can be cooled and allowed to solidify. The liquid growth medium can be generally cooled rapidly in order to minimize back-conversion of diamond to graphite. This can be accomplished by quenching with an external cooling fluid and/or by substituting the hydrogen source gas with a cooler gas. Alternatively, cooling conduits can be integrated into the furnace to allow rapid conduction of heat away from the furnace, e.g. oriented within the furnace and/or adjacent to walls of the furnace.

Once cooled, the solidified mass includes diamond particles embedded in a metal matrix. The metal matrix can be removed by mechanical and or chemical means. For example, larger masses can be mechanically reduced in size. Individual diamond particles can be liberated from the metal by dissolving the metal using an appropriate acid. The diamond catalyst alloy can then be optionally cleaned, purified, and/or recycled for sale or reuse.

In yet another alternative embodiment, the grown diamond particles can be recovered from the molten liquid phase before cooling. For example, when the diamond seeds are affixed to a substrate, the substrate can be lifted or removed from the liquid growth medium. Any residual material can be cleaned or removed by chemical washing. The grown diamond particles can then be readily removed from the substrate by mechanical shearing and/or chemical washing.

In still another embodiment, grown diamond particles can be collected in a lower portion of the furnace by allowing the particles to settle. This can be done by adjusting the convective flow within the furnace, such as by reducing or eliminating inlet gas flow rates. Furthermore, flow rates during growth can be adjusted so that once a diamond particle reaches a predetermined size it will no longer be dispersed due to its weight. These particles can be collected in a dedicated trough or other lower area of a furnace having such a feature therein. Transparent or translucent walls or windows, e.g. quartz, in the furnace can be oriented to allow for visual detection of such growth and accumulation of diamond particles. Whether diamond particles tend to float or sink within the liquid medium depends on the density, e.g. diamond particles tend to float on molten metal catalyst but sink in molten organic adamantane liquid, and the degree of convective mixing.

The diamond particles of the present invention can generally be grown to almost any size and can be substantially free of crystal and impurity defects, depending on the specific conditions and materials used.

As an illustration of the above principles, FIG. 1 illustrates one apparatus which can be used to practice the present invention. A diamond growth apparatus 10 is shown having a substantially enclosed furnace 12 having an upper portion 14 and a lower portion 16. The upper and lower portions can be removably detachable to allow access to internal volumes for maintenance and cleaning. The upper portion can include an outlet 18 and the lower portion can include an inlet 20. The furnace can be formed of any suitable high temperature material having a melting point above the desired operating temperature and suitable durability for long term use. Such high temperature materials can include a large number of ceramics, metals, metal alloys, and composite materials. Non-limiting examples of suitable materials can include stainless steel, quartz, refractory metals, refractory metal carbides, and the like.

A porous ceramic 22 can be oriented in the inlet 20 to allow hydrogen gas into the furnace 12 and prevent egress of molten liquid from the furnace during operation. The porous ceramic can be used to sparge the gas and/or to retain a suitable hydrogen catalyst, as described in more detail previously. The porous ceramic can be a single layer or may include multiple layers, e.g. a zeolite layer 24 adjacent a sintered alumina layer 26 as illustrated. As can be seen, the porous ceramic can be oriented such that the incoming hydrogen gas passes through to enter the furnace while also preventing molten liquid from escaping through the same inlet.

A hydrogen source 28 can be fluidly connected to the inlet 20. The hydrogen source can optionally include a compressor or other mechanism allowing for variable adjustment of injection pressures to sufficiently inject the hydrogen-containing gas (or liquid) into the liquid growth medium.

A heating mechanism can be thermally associated with the furnace 12. For example, the heating mechanism can be electrically resistive heating coils 30 oriented on outer surfaces of the lower portion 16 of the furnace. With this orientation, heat transferred into the liquid growth medium creates upward convective currents within the liquid to augment current caused by incoming hydrogen gas.

The outlet 18 can be configured to allow excess gas to escape from the furnace. This exiting gas can be burned at a flame nozzle 32, recycled, released or otherwise disposed of The outlet can be substantially unimpeded and in fluid communication with atmosphere such that the interior of the furnace is substantially at atmospheric pressures (or within about 2 atm). Alternatively, a pressure control relief valve may be included at the outlet in order to increase internal pressures to a desired level. This can also be used to control flame height.

As discussed extensively above, the furnace can enclose the liquid growth medium 34 which includes a plurality of diamond seeds 36. FIG. 1 also shows a second molten liquid phase layer 38 within an upper portion of the internal furnace volume. In this very specific embodiment, the second layer 38 can include adamantane (melting point of 270° C.) as a carbon source and nano-platinum in a zeolite powder as a hydrogen catalyst, while the first liquid growth medium layer 34 includes Ni or Pd alloy with La or Ce as a diamond growth catalyst alloy and nanodiamond as diamond seeds.

Figure 4:
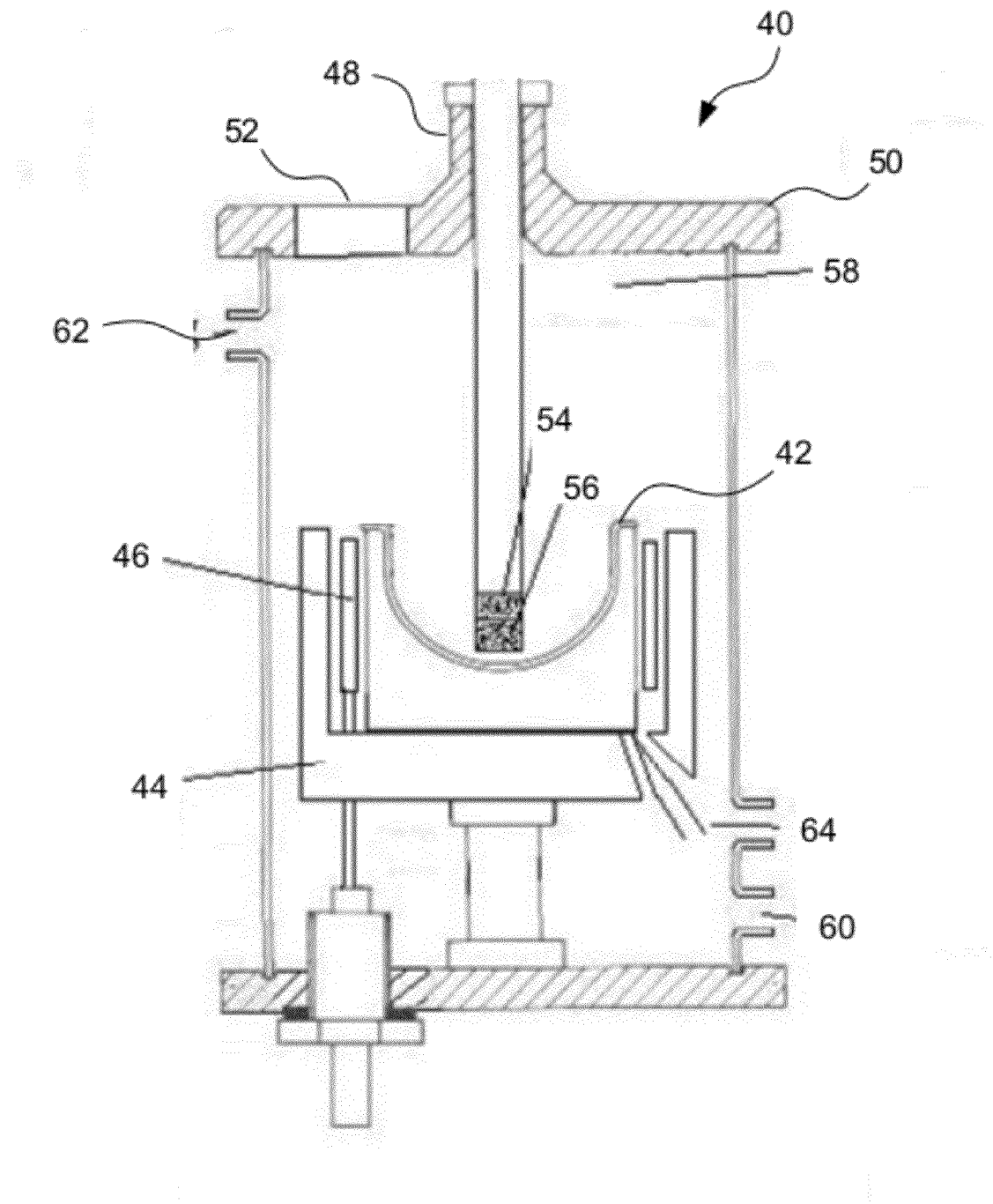
FIG. 4 is a side cross-sectional view of a diamond growth furnace having an internal crucible in accordance with another embodiment of the present invention.

FIG. 4 shows another alternative embodiment of a diamond growth apparatus 40 of the present invention. In this embodiment, a high temperature crucible 42 can be suspended within the furnace by a thermally insulating stand 44. The crucible can hold the seeds and/or molten liquid phase as previously described and can comprise any suitable high temperature material such as, but not limited to, graphite, refractory metal, and the like. A heater 46 can be used to heat materials in the crucible. Although other designs can be used, an annular heater can be disposed in an annular space between the crucible and side walls of the thermally insulating stand.

An inlet 48 can provide for introduction of a hydrogen gas into molten liquid held within the crucible 42. As shown, the inlet can be oriented through a top cap 50 of the furnace body. This top cap can include an optional view window 52 to allow visual monitoring of the furnace contents. The inlet can be formed of any suitable material but can optionally extend downward into the crucible. Non-limiting examples of suitable material for the inlet can include quartz. As previously described, a porous ceramic can be oriented within the inlet to provide a mass transfer barrier and optionally further include hydrogen catalyst materials. FIG. 4 shows a two-layer outlet ceramic of sintered alumina 54 and a zeolite 56 oriented at a bottom end of the inlet conduit 48.

FIG. 4 also includes open space 58 between the crucible 42 and heater 46 components and the furnace walls. This open space have a composition which is controlled to provide a desired chemical composition as well as provide additional temperature control. For example, a hydrogen environment can be maintained with the open space. An optional cooling gas can be introduced via gas inlet 60. Typically, an inert gas such as argon can be used, although other gases can be used to prevent overheating of the crucible contents. A gas outlet 62 can be included to allow egress of excess gases and can optionally include a vacuum line to facilitate removal of gases and/or reduction of operating pressures. Furthermore, thermocouples 64 can be operatively connected to the crucible to monitor temperatures of the material placed in the crucible. It will be understood that the principles and materials described previously with respect to FIG. 1 also apply to the embodiment of FIG. 4, as well as any variations in design and operation which are consistent with the present invention.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

More specifically, while illustrative exemplary embodiments of the invention have been described herein, the present invention is not limited to these embodiments, but includes any and all embodiments having modifications, omissions, combinations (e.g., of aspects across various embodiments), adaptations and/or alterations as would be appreciated by those in the art based on the foregoing detailed description. The limitations in the claims are to be interpreted broadly based on the language employed in the claims and not limited to examples described in the foregoing detailed description or during the prosecution of the application, which examples are to be construed as non-exclusive.

What is claimed is:

1. A method of growing diamond, comprising:
   a) growing at least one diamond mass from a diamond seed material in a liquid growth medium of a carbon source, a diamond growth catalyst, and a dissociated hydrogen of a hydrogen source, said growing occurring within a temperature profile for a time sufficient to allow three dimensional growth of the diamond mass from the carbon source, said liquid growth medium including a molten liquid phase which is a continuous phase having the hydrogen source dispersed therein under a low pressure; and
   b) removing the diamond mass either from the molten liquid phase or from a solidified mass formed from cooling the molten liquid phase.

2. The method of claim 1, wherein the diamond growth catalyst is a diamond growth catalyst alloy which forms at least a portion of the molten liquid phase.

3. The method of claim 2, wherein the diamond growth catalyst alloy is an alloy of a diamond catalyst and a rare earth element.

4. The method of claim 3, wherein the diamond growth catalyst has a melting point from about 400° C. to about 800° C.

5. The method of claim 1, wherein the carbon source is a particulate carbon source, a gas carbon source, or a liquid carbon source.

6. The method of claim 1, wherein the diamond seed material is a plurality of diamond seeds which are dispersed in the liquid growth medium and from which a plurality of diamond particles grow with carbon from the carbon source to form the diamond mass.

7. The method of claim 1, wherein the diamond seed material is a crystalline wafer.

8. The method of claim 1, wherein the hydrogen source is hydrogen gas.

9. The method of claim 1, wherein the low pressure is from vacuum to 10 atm.

10. The method of claim 1, wherein the molten liquid phase comprises from 20 vol % to about 99 vol % of the liquid growth medium.

11. The method of claim 1, wherein the liquid growth medium further includes a second molten liquid phase having a density less than the first molten liquid phase.

12. The method of claim 1, wherein the liquid growth medium further includes a hydrogen catalyst.

13. The method of claim 1, wherein the molten liquid phase further comprises an additive in an amount less than 1 wt %.

14. The method of claim 1, wherein the heating is accomplished using an electrically heated and substantially enclosed furnace including a hydrogen source inlet and a gas purge outlet.

15. The method of claim 1, wherein the temperature profile is substantially constant during growth.

16. The method of claim 1, wherein the diamond mass grows at a growth rate from about 10 μm/hr to about 100 μm/hr per diamond surface.

17. The method of claim 1, wherein the diamond mass is substantially free of crystal and impurity defects.

18. The method of claim 1, further comprising cooling the molten liquid phase prior to removing the diamond mass therefrom.

19. The method of claim 1, wherein the hydrogen source is injected into the liquid growth medium during heating so as to create an upward mixing flow within the liquid growth medium sufficient to keep the particulate carbon source and other dispersed solids suspended.

* * * * *